United States Patent
Khesbak et al.

(10) Patent No.: US 10,404,166 B2
(45) Date of Patent: Sep. 3, 2019

(54) SYSTEM EFFICIENCY IMPROVEMENT FOR CELLULAR SIGNALS

(71) Applicant: SKYWORKS SOLUTIONS, INC., Woburn, MA (US)

(72) Inventors: Sabah Khesbak, Irvine, CA (US); Florinel G. Balteanu, Irvine, CA (US); Roman Zbigniew Arkiszewski, Oak Ridge, NC (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/993,220

(22) Filed: May 30, 2018

(65) Prior Publication Data
US 2018/0351454 A1 Dec. 6, 2018

Related U.S. Application Data

(60) Provisional application No. 62/513,065, filed on May 31, 2017.

(51) Int. Cl.
| | |
|---|---|
| *H02M 3/156* | (2006.01) |
| *H03F 1/02* | (2006.01) |
| *H03F 3/195* | (2006.01) |
| *H03F 3/24* | (2006.01) |
| *H03F 3/45* | (2006.01) |

(52) U.S. Cl.
CPC .......... *H02M 3/156* (2013.01); *H03F 1/0227* (2013.01); *H03F 1/0238* (2013.01); *H03F 3/195* (2013.01); *H03F 3/24* (2013.01); *H03F 3/245* (2013.01); *H03F 3/45183* (2013.01); *H03F 2200/411* (2013.01); *H03F 2200/451* (2013.01); *H03F 2200/516* (2013.01)

(58) Field of Classification Search
CPC .......... H02M 3/156; H03F 3/24; H03F 3/195; H03F 2200/451; H03F 1/0227; H03F 3/245; H03F 3/45183; H03F 2200/411; H03F 2200/516
See application file for complete search history.

(56) References Cited

U.S. PATENT DOCUMENTS

| | | | | |
|---|---|---|---|---|
| 2002/0175764 A1* | 11/2002 | Matsuura | .............. | H03F 1/0227 330/302 |
| 2015/0124661 A1* | 5/2015 | He | ........................ | H04L 5/0066 370/278 |

\* cited by examiner

*Primary Examiner* — Adolf D Berhane
*Assistant Examiner* — Jye-June Lee
(74) *Attorney, Agent, or Firm* — Chang & Hale LLP

(57) ABSTRACT

Described herein are systems, architectures, circuits, devices, and methods for a DC-DC converter that dynamically adjusts a supply voltage to a power amplifier based on the number of resource blocks in a signal to be transmitted. The disclosed technologies estimate the number of resource blocks in a signal, generate a signal corresponding to the estimated number of resource blocks, and modify a supply voltage based on the generated signal. The disclosed DC-DC converters can be integrated into systems that employ power management strategies such as average power tracking ("APT"). In addition, the disclosed technologies can be used to improve existing APT-based systems.

20 Claims, 12 Drawing Sheets

SYSTEM EFFICIENCY IMPROVEMENT FOR CELLULAR SIGNALS

CROSS-REFERENCE TO RELATED APPLICATIONS

This application claims priority to U.S. Provisional Application No. 62/513,065 filed May 31, 2017 and entitled "System Efficiency Improvement for Cellular Signals," which is expressly incorporated by reference herein in its entirety for all purposes.

BACKGROUND

Field

The present disclosure generally relates to power amplifiers for wireless devices, and in particular to power supplies for power amplifiers.

Description of Related Art

In wireless devices, such as cellular phones or smart phones, transmitted information is generally amplified prior to transmission. Typically, a power amplifier is used to amplify signals from a transceiver prior to delivery to an antenna for transmission. The power amplifier is typically a component that consumes a relatively large amount of energy. It is generally desirable to reduce the amount of energy consumed by the power amplifier to increase the battery life of the wireless device (e.g., to increase the talk time or usage time).

SUMMARY

According to a number of implementations, the present disclosure relates to a signal amplifier architecture for amplifying a cellular signal. The signal amplifier includes an amplifier having a voltage port, an input port, and an output port, the amplifier configured to receive a supply voltage at the voltage port to provide power to the amplifier, to receive an input signal at the input port, and to provide an amplified output signal at the output port. The signal amplifier also includes a DC-DC converter having a reference port to receive a reference voltage, a coupler port to receive a coupler signal that is correlated to the amplified output signal, and a supply port to provide the supply voltage to the amplifier, the DC-DC converter including one or more components configured to modify the reference voltage based at least in part on an estimate of the number of resource blocks in the amplified output signal.

In some embodiments, the DC-DC converter is implemented in an average power tracking system. In some embodiments, the estimate of the number of resource blocks is determined based at least in part on the coupler signal. In further embodiments, the signal amplifier architecture further includes a coupler coupled to the output port of the amplifier, the coupler configured to generate the coupler signal.

In some embodiments, the signal amplifier architecture further includes a controller configured to provide a biasing current to the amplifier. In some embodiments, the amplifier includes a first stage coupled to the input port and a second stage coupled to the output port. In further embodiments, the supply voltage is provided to the first stage and to the second stage.

In some embodiments, the DC-DC converter is configured to adjust the reference voltage to provide a targeted supply voltage to the amplifier. In further embodiments, the DC-DC converter further includes a detector and a filter that are configured to generate a bandwidth signal indicative of a bandwidth of the amplified output signal. In yet further embodiments, the DC-DC converter further includes a conversion module configured to receive the bandwidth signal and to generate a modification voltage that corresponds to the bandwidth based on the bandwidth signal. In yet further embodiments, the DC-DC converter further includes an addition component configured to generate a DC control voltage by combining the reference voltage and the modification voltage, the supply voltage provided by the DC-DC converter corresponding to the resulting DC control voltage. In yet further embodiments, the conversion module includes a plurality of cells and the output of individual cells of the plurality of cells is combined to generate the modification voltage. In yet further embodiments, the detector includes a first differential detector and a second differential detector and the filter includes at least a high pass filter coupled to the first differential detector and a low pass filter coupled to the second differential detector.

According to a number of implementations, the present disclosure relates to a radio-frequency (RF) module that includes a packaging substrate configured to receive a plurality of components. The RF module also includes a power amplification system implemented on the packaging substrate, the power amplification system including an amplifier having a voltage port, an input port, and an output port, the amplifier configured to receive a supply voltage at the voltage port to provide power to the amplifier, to receive an input signal at the input port, and to provide an amplified output signal at the output port; and the power amplification system also including a DC-DC converter having a reference port to receive a reference voltage, a coupler port to receive a coupler signal that is correlated to the amplified output signal, and a supply port to provide the supply voltage to the amplifier, the DC-DC converter including one or more components configured to modify the provided supply voltage based at least in part on an estimate of the number of resource blocks in the amplified output signal.

In some embodiments, the RF module is a front-end module (FEM). In some embodiments, the amplifier and the DC-DC converter are implemented on separate chips. In some embodiments, the amplifier and the DC-DC converter are implemented on the same chip.

According to a number of implementations, the present disclosure relates to a wireless device that includes a transceiver configured to generate an input radio-frequency (RF) signal. The wireless device also includes a front-end module (FEM) in communication with the transceiver, the FEM including a packaging substrate configured to receive a plurality of components, the FEM further including a power amplification system implemented on the packaging substrate, the power amplification system configured to amplify the input RF signal to generate an amplified output RF signal, the power amplification system including an amplifier having a voltage port, an input port, and an output port, the amplifier configured to receive a supply voltage at the voltage port to provide power to the amplifier, to receive the input RF signal at the input port, and to provide the amplified output RF signal at the output port; and the power amplification system also including a DC-DC converter having a reference port to receive a reference voltage, a coupler port to receive a coupler signal that is correlated to the amplified output RF signal, and a supply port to provide the supply voltage to the amplifier, the DC-DC converter including one or more components configured to modify the provided supply voltage based at least in part on an estimate of the number of resource blocks in the amplified output RF signal. The wireless device also includes an antenna in communication with the FEM, the antenna configured to transmit the output RF signal.

In some embodiments, the power amplification system further includes a coupler configured to generate a coupler signal that corresponds to the amplified output RF signal. In further embodiments, the DC-DC converter includes a detector, a filter, and a conversion module that are configured to receive the coupler signal and to generate a bandwidth signal corresponding to a number of resource blocks in the amplified output RF signal based on the coupler signal.

According to a number of implementations, the present disclosure relates to a method of modifying a supply voltage to an amplifier. The method includes generating a coupler signal corresponding to an amplified output signal generated by an amplifier. The method also includes determining a bandwidth of the amplified output signal based at least in part on the coupler signal. The method also includes generating a bandwidth voltage corresponding to a number of resource blocks in the amplified output signal, the number of resource blocks calculated based at least in part on the determined bandwidth. The method also includes modifying a supply voltage to the amplifier based at least in part on the bandwidth voltage.

In some embodiments, modifying the supply voltage includes decreasing the supply voltage in response to a decrease in the number of resource blocks. In further embodiments, the method further includes receiving a reference voltage from a power supply control system, wherein the reference voltage is combined with the bandwidth voltage to modify a supply voltage provided to the power amplifier system.

According to a number of implementations, the present disclosure relates to a method of modifying a supply voltage to an amplifier. The method includes calculating an estimate of a number of resource blocks in a signal passing through the power amplifier system. The method also includes generating a modification signal corresponding to the estimated number of resource blocks. The method also includes modifying a power supply control signal for a DC-DC converter based on the modification signal.

In some embodiments, modifying the power supply control signal includes decreasing the power supply control signal in response to a decrease in the number of resource blocks. In some embodiments, the method further includes combining the modification signal with the power supply control signal to generate an adjusted power supply control signal. In further embodiments, the method further includes providing the adjusted power supply control signal to the DC-DC converter.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
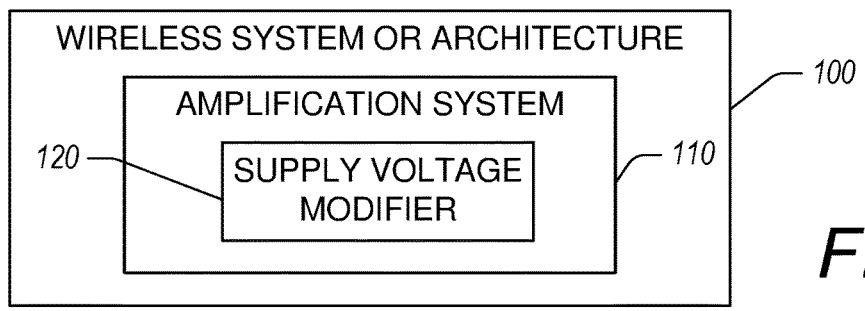
FIG. 1 illustrates an example wireless system or architecture having an amplification system with a supply voltage modifier that is configured to dynamically adjust a supply voltage to amplifiers in the amplification system based at least in part on the amount of information in a signal to be amplified.

The headings provided herein, if any, are for convenience only and do not necessarily affect the scope or meaning of the claimed invention.

Overview

Prior to transmission, signals are generally amplified in wireless devices using power amplifiers. Power amplifiers receive a supply voltage to power the amplification process. However, due to modulation schemes, the power amplifier utilizes a variable amount of power, the power varying as a function of time and the bandwidth of the signal. Schemes have been developed to dynamically adjust power supplied to power amplifiers to increase efficiency and to reduce energy consumption. Examples of such schemes include envelope tracking ("ET") and average power tracking ("APT"). ET and APT are common methods of adjusting power to power amplifiers based on signal requirements. For example, ET and APT adjust or control the voltage and/or current provided to a power amplifier to improve or enhance efficiency.

A battery or a voltage source (e.g., a low-dropout regulator or LDO) can be used to provide a supply voltage to a power amplifier. However, this may be inefficient due at least in part to the power amplifier not requiring high voltage for high power, rather the power amplifier may require high current. Thus, supplying a voltage that is higher than necessary for the power amplifier may result in wasted power. Accordingly, it may be advantageous to adjust the supply voltage by putting a system between the battery or voltage source and the power amplifier, the system configured to lower the voltage, thereby increasing the current, supplied to the power amplifier. Such a system can be configured to supply a lower voltage to the power amplifier than is provided by the battery or voltage source, essentially trading voltage for current. For example, the power input to the system (e.g., from the battery or voltage source) is approximately equal to the output power from the system (e.g., the power provided to the power amplifier).

Average power tracking and envelope tracking are power management strategies that dynamically adjust the supply voltage to signal amplifiers to reduce wasted power or to increase transmission efficiency. For example, these strategies can be configured to reduce voltage and/or current to a signal amplifier when lower transmitting power is required. In cellular signals, speech and data can be accumulated into resource blocks (RBs) so that if more data is being sent, more resource blocks are allocated to the signal. Generally, the more data in a signal the more power required by the amplifier, and consequently higher voltage from a DC-DC converter.

For example, for a wider bandwidth LTE signal in an APT system, the supply voltage (e.g., Vcc) is set based on a relatively high number of resource blocks in the signal (e.g., 100 RBs) to pass requirements in the Evolved Universal Terrestrial Radio Access (E-UTRA) specification. However, if the signal contains less information than the expected amount, efficiency is degraded. For example, setting the supply voltage based on a signal with 100 RBs can degrade system efficiency at lower numbers of resource blocks due at least in part to the same supply voltage being used for 20 MHz bandwidth signals with 100 RBs as for 20 MHz bandwidth signals with 20 RBs. The supply voltage is set high enough so that the 20 MHz signal with 100 RBs passes transmission requirements (e.g., E-UTRA requirements). However, the supply voltage required for a 20 MHz signal with 20 RBs to pass the same transmission requirements is lower than for the signal with 100 RBs. Consequently, system efficiency is degraded when the number of resource blocks changes in the signal to be transmitted.

Accordingly, described herein are circuits, devices, systems, and methods that scale the supply voltage (e.g., APT Vcc) to improve or optimize the efficiency at lower resource block counts (e.g., for LTE systems). This can be done by filtering the bandwidth of the signal (which correlates to the number of carried resource blocks), determining the RMS value of the filtered signal, and determining a correcting voltage that can be algebraically added to the main DC-DC control reference voltage to adjust the supply voltage to the signal amplifier, thereby achieving a targeted supply voltage that improves or optimizes the efficiency of the system transmitting signals with fewer resource blocks than the assumed maximum number of resource blocks in a signal (e.g., 100 RBs). As the maximum number of resource blocks increases (e.g., in systems that employ carrier aggregation or under evolving communication standards), the disclosed systems that improve efficiency based on scaling supply voltage with the number of resource blocks may provide even greater benefits.

In typical systems, a power supply control signal is fixed in a power management system (e.g., in a look-up table or LUT) and can vary with an average power (e.g., APT systems) or an envelope (e.g., ET systems) of a signal to be amplified. Accordingly, described herein are DC-DC converters that adjust the power supply control signal at the converter. This advantageously allows the voltage (and the power) to the signal amplifiers to be adjusted without going through the software or the memory of the power management system. The disclosed technologies can interface directly with the DC-DC converter so that they can be added as improvements to amplifier architectures with power amplification systems. The output of the disclosed DC-DC converters can be discrete or continuous, thereby providing discrete or continuous control of the voltage supplied to the amplifiers.

The disclosed smart DC-DC converters improve efficiency in an amplification system by scaling the power provided to a signal amplifier based at least in part on the amount of information in the signal to be amplified. In some embodiments, the power supply control signal (e.g., Vref) is sent to a DC-DC converter to control the supply voltage (e.g., Vcc) provided by the converter. The disclosed technologies can interject in this process to modify the power supply control signal based at least in part on the number of resource blocks in the signal. The modified power supply control signal (e.g., Vref') is sent to the converter, resulting in a targeted supply voltage output by the converter. Thus, the disclosed technologies can scale the supply voltage based at least in part on the number of resource blocks in the signal.

Furthermore, described herein are systems, architectures, circuits, devices, and methods for a DC-DC converter that dynamically adjusts a supply voltage to a signal amplifier (e.g., a power amplifier) based on the bandwidth or amount of information (e.g., resource blocks) in a signal to be transmitted. The disclosed technologies include circuits, devices, and systems that estimate the number of resource blocks in a signal, generate a signal corresponding to the estimated number of resource blocks, and modify a supply voltage based on the generated signal. In some embodiments, the disclosed circuits, devices, and systems can be incorporated into a smart DC-DC converter that receives a control voltage from an APT system and adjusts that control voltage based on the amount of information in the signal to be transmitted. The adjusted control voltage can then be used to provide a targeted supply voltage to a signal amplifier where the targeted supply voltage is based at least in part on the information in the signal to be transmitted. Accordingly, the disclosed DC-DC converters can be integrated into existing systems that employ power management strategies such as APT. In addition, the disclosed circuits, devices, and systems can be used to improve existing APT-based systems.

To estimate the number of resource blocks, the disclosed circuits, devices, and systems can be configured to filter a bandwidth of a signal and calculating a root-mean-square (RMS) value of the filtered signal. The disclosed circuits, devices, and systems can then be configured to determine a correcting voltage that is algebraically added to a main control reference voltage provided to a DC-DC converter. The combination of the correcting voltage and the main control reference voltage results in an adjusted control voltage provided to the DC-DC converter that alters the supply voltage to a signal amplifier. The altered or adjusted supply voltage improves the efficiency of an amplification system as a function of resource blocks in the signal relative to an amplification system that employs power management strategies that do not account for the amount of information (e.g., number of resource blocks) in a signal to be transmitted.

As used herein, the term resource block (RB) refers to a unit of resources that can be allocated to a user in a wireless signal. However, the term resource block can also be used to refer to the amount of information in a wireless signal. Other terms, such as bandwidth, may also be used to refer to the amount of information in a wireless signal.

By way of example, there are two types of frame structure in the LTE standard, Type 1 and Type 2. Type 1 uses Frequency Division Duplexing (uplink and downlink separated by frequency), and TDD uses Time Division Duplexing (uplink and downlink separated in time). Within the LTE standard, there are at least six time units: a frame, a half-frame, a sub-frame, a slot, a symbol, and the basic time unit (Ts). A resource block refers to the smallest unit of resources that can be allocated within the LTE standard. The resource block is typically 180 kHz wide in frequency and 1 slot long in time. In frequency, resource blocks are typically 12×15 kHz subcarriers wide or 24×7.5 kHz subcarriers wide. The number of subcarriers used per resource block for most channels and signals is 12 subcarriers. Accordingly, as used herein, the term resource block can refer to the smallest unit of resources that can be allocated in a wireless signal regardless of the communication standard.

Example Amplification Systems

FIG. 1 illustrates an example wireless system or architecture 100 having an amplification system 110 with a supply voltage modifier 120. In some embodiments, the amplification system 110 can be implemented as one or more devices, and such device(s) can be utilized in the wireless architecture 100. In some embodiments, the wireless architecture 100 can be implemented in, for example, a portable wireless device. Examples of such wireless devices are described herein.

The amplification system 110 includes the supply voltage modifier 120 that is configured to dynamically adjust a supply voltage to amplifiers in the amplification system 110 based at least in part on the amount of information in a signal to be amplified. In some embodiments, the supply voltage modifier 120 is configured to determine the amount of information based at least in part on a number of resource blocks in the signal. The supply voltage modifier 120 can include a DC-DC converter that receives a reference voltage and modifies the reference voltage based at least in part on the amount of information in the signal to be amplified. In that way, the supply voltage modifier 120 can be implemented in an average power tracking system where the reference voltage is determined based on the average power of the signal to be amplified. For example, the supply voltage modifier 120 can be configured to receive the reference voltage determined by the average power tracking system and to modify that reference voltage based on the amount of information (e.g., number of resource blocks) in the signal to be amplified. Thus, the supply voltage modifier 120 can be implemented with little or no modification to the average power tracking system.

Figure 2:
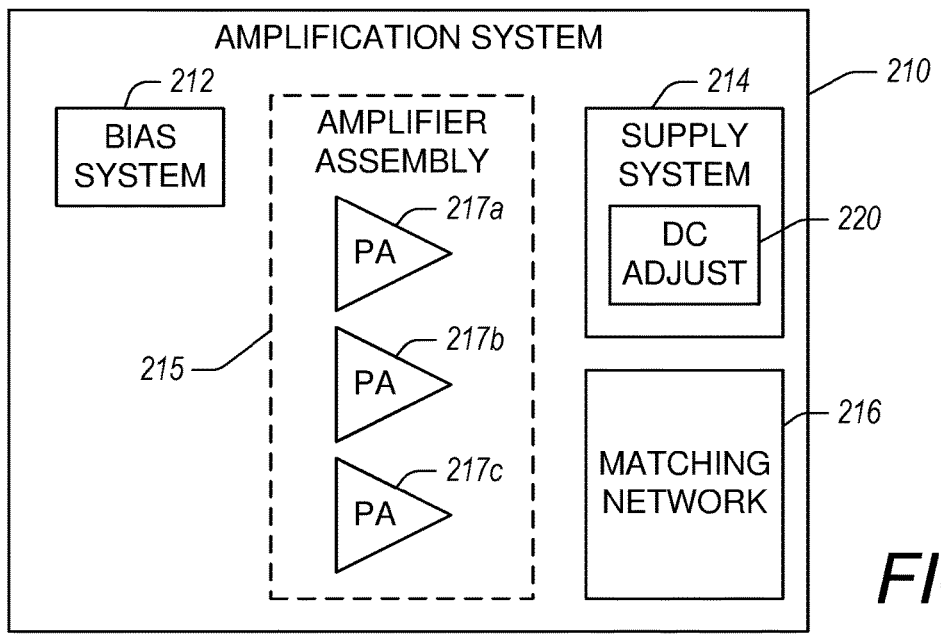
FIG. 2 illustrates an example amplification system that includes a radio-frequency (RF) amplifier assembly having one or more power amplifiers (PAs) and a supply system that includes a DC voltage adjust subsystem.

FIG. 2 illustrates an example amplification system 210 that includes a radio-frequency (RF) amplifier assembly 215 having one or more power amplifiers (PAs) 217a-217c. In the amplifier assembly 215, three PAs 217a-217c are depicted as forming the RF amplifier assembly 215. It should be understood that other numbers of PA(s) can also be implemented. It should also be understood that one or more features of the present disclosure can also be implemented in RF amplifier assemblies having other types of RF amplifiers other than power amplifiers.

In some embodiments, the RF amplifier assembly 215 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs 217a-217c in the amplification system 210 are typically biased by a bias system 212. Further, supply voltages for the PAs 217a-217c are provided by a supply system 214 having a DC voltage adjust 220 that is configured to dynamically adjust power to the power amplifiers 217a-217c based at least in part on the amount of information (e.g., number of resource blocks) in the signal to be amplified by the power amplifiers 217a-217c, examples of which are disclosed in greater detail herein. In some embodiments, either or both of the bias system 212 or the supply system 214 can be included in the foregoing packaged module having the RF amplifier assembly 210.

In some embodiments, the amplification system 210 can include a matching network 216. Such a matching network can be configured to provide input matching and/or output matching functionalities for the RF amplifier assembly 215.

Figures 3A, 3B, 3C:
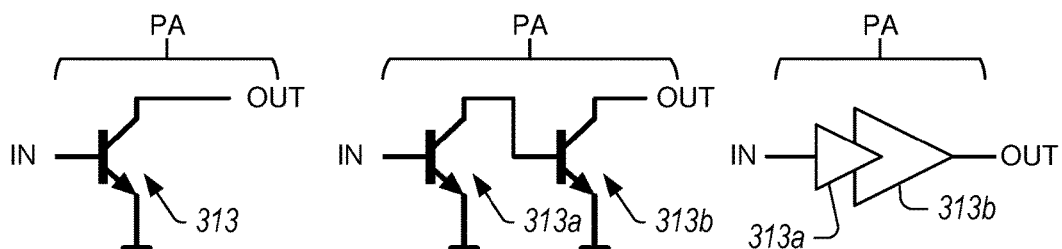
FIGS. 3A, 3B, 3C, 3D, and 3E illustrate non-limiting examples of different power amplifier configurations.

For the purpose of description, it will be understood that each PA 217a-217c of FIG. 2 can be implemented in a number of ways. FIGS. 3A-3E illustrate non-limiting examples of how such a PA can be configured. FIG. 3A illustrates an example PA having an amplifying transistor 313, where an input signal (IN) is provided to a base of the transistor 313, and an amplified signal (OUT) is output through a collector of the transistor 313. It should be understood that the input signal can be a radio-frequency (RF) signal.

FIG. 3B illustrates an example PA having a plurality of amplifying transistors (e.g., 313a, 313b) arranged in stages. An input signal (IN) is provided to a base of the first transistor 313a, and an amplified signal from the first transistor 313a is output through its collector. The amplified signal from the first transistor 313a is provided to a base of the second transistor 313b, and an amplified signal from the second transistor 313b is output through its collector to thereby yield an output signal (OUT) of the PA.

In some embodiments, the foregoing example PA configuration of FIG. 3B can be depicted as two or more stages as illustrated in FIG. 3C. The first stage 313a can be configured as, for example, a driver stage; and the second stage 313b can be configured as, for example, an output stage.

Figures 3D, 3E:
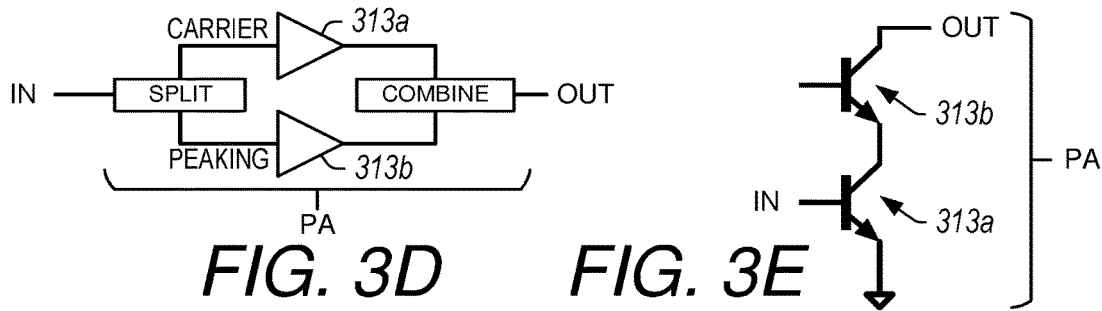

FIG. 3D illustrates that in some embodiments, a PA can be configured as a Doherty PA. Such a Doherty PA can include amplifying transistors 313a, 313b configured to provide carrier amplification and peaking amplification of an input signal (IN) to yield an amplified output signal (OUT). The input signal can be split into the carrier portion and the peaking portion by a splitter. The amplified carrier and peaking signals can be combined to yield the output signal by a combiner.

FIG. 3E illustrates that in some embodiments, a PA can be implemented in a cascode configuration. An input signal (IN) can be provided to a base of the first amplifying transistor 313a operated as a common emitter device. The output of the first amplifying transistor 313a can be provided through its collector and be provided to an emitter of the second amplifying transistor 313b operated as a common base device. The output of the second amplifying transistor 313b can be provided through its collector to yield an amplified output signal (OUT) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Amplification Systems that Adjust Supply Voltage Based on Resource Blocks

Figure 4:
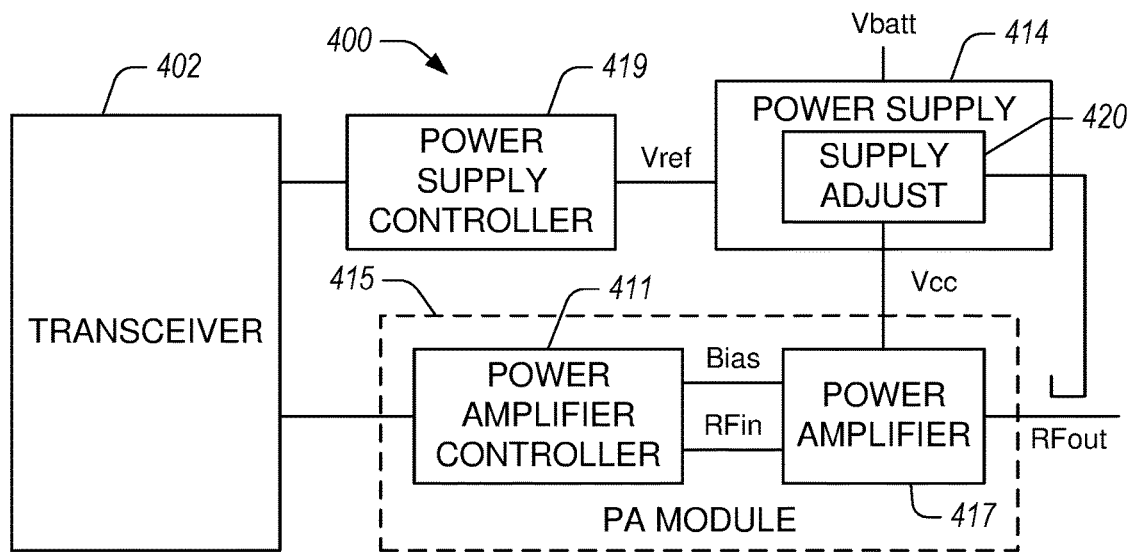
FIG. 4 illustrates a block diagram of a power amplification configuration with independent power amplifier control and power supply control having a supply adjust component to adjust a supply voltage based at least in part on the number of resource blocks in the signal to be amplified.

FIG. 4 illustrates a block diagram of a power amplification configuration 400 with independent power amplifier control and power supply control. The power amplification configuration 400 can be implemented in, for example, a hand-held mobile device. The power amplification configuration 400 includes a power amplifier (PA) 417 and a power supply (PS) 414. In some embodiments, the power supply 414 can include a DC-DC converter or a switching mode power supply (SMPS), such as a boost converter, a buck converter, a buck-boost converter, a charge pump, etc.

The power supply 414 receives an input voltage (e.g., Vbatt from a battery or from another voltage source) and supplies a supply voltage (Vcc) to the power amplifier 417. The power amplifier 417 is powered by the supply voltage. The magnitude of the supply voltage can be set by a power supply control signal, Vref, received by the power supply 414 and provided by a power supply controller 419. The power supply controller 419 can generate the power supply control signal based on a transceiver control signal received from a transceiver 402. In some embodiments, the power supply controller 419 generates the power supply control signal based on an average power or an envelope of the signal to be amplified and transmitted, such as in an APT or ET system.

The power amplifier 417 receives an input signal (RFin) and supplies, as an output signal (RFout), an amplified version of the input signal. The input signal can be received from a power amplifier controller 411 that receives the signal from the transceiver 402 (as illustrated in FIG. 4), can be received directly from the transceiver 402, or can be received from another source. The power amplifier 417 is biased by a power amplifier control signal, (e.g., a bias signal such as a bias voltage or a bias current) received by the power amplifier 417 and provided by the power amplifier controller 411. The power amplifier controller 411 can generate the power amplifier control signal based on a transceiver control signal received from the transceiver 402. The power amplifier controller 411 and power amplifier 417 can be integrated onto a single module 415. In some embodiments, the power amplifier controller 411 and the power amplifier 417 can be integrated on a single die. In some implementations, the power supply 414 can also be integrated onto the module 415 or integrated on the die.

To improve the efficiency of the amplification process, the power supply 414 includes a supply adjust component 420 configured to adjust the supply voltage (Vcc) supplied to the power amplifier 417. The supply adjust component 420 is configured to adjust the supply voltage (e.g., by adjusting the power supply control signal) based on an estimate of the number of resource blocks in the amplified signal (RFout). The supply adjust component 420 can be configured to receive the power supply control signal (Vref) from the power supply controller 419 and to adjust the power supply control signal. Consequently, the power supply 414 provides an adjusted supply voltage (Vcc) to the power amplifier 417, wherein the supply voltage is adjusted relative to the supply voltage that would have been provided absent the adjustment to the power supply control signal by the supply adjust component 420.

The supply adjust component 420 can be configured to receive a coupler signal that is correlated to the amplified output signal (RFout). The supply adjust component 420 can be configured to filter the amplified signal and to determine a variance or standard deviation of the filtered signal (e.g., the root-mean-square or RMS value of the filtered signal). The supply adjust component 420 can be configured to generate a signal (e.g., a voltage) that is used to modify the power supply control signal (Vref) from the power supply controller 419, such as by combining the signals or voltages together. This adjusted power supply control voltage can then be used to generate the supply voltage (Vcc) provided by the power supply 414. Accordingly, the supply adjust component 420 can be added to an amplification architecture to improve efficiency of the amplification process by directing the power supply control signal to the supply adjust component 420 rather than directly to the power supply 414 (or by including the supply adjust component 420 in the power supply 414). In addition, a coupler signal correlated to the amplified signal can be provided to the supply adjust component 420 so that the supply adjust component 420 can determine the targeted adjustment to the power supply control signal that results in a targeted supply voltage to the power amplifier 417.

Figure 5:
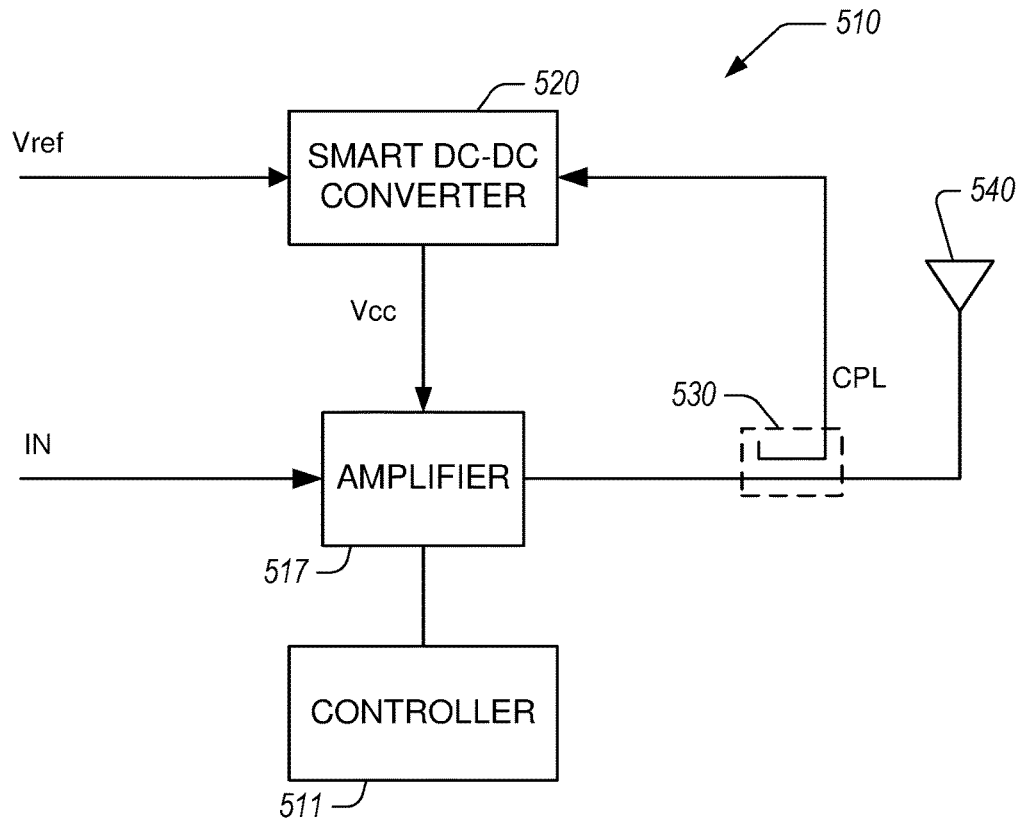
FIG. 5 illustrates a block diagram of an example power amplification configuration having a smart DC-DC converter configured to adjust a supply voltage to a signal amplifier based on the amount of information in the signal being transmitted.

FIG. 5 illustrates a block diagram of an example power amplification configuration 510 having a smart DC-DC converter 520 configured to adjust a supply voltage (Vcc) to a signal amplifier 517 based on the amount of information in the signal being transmitted. The smart DC-DC converter 520 includes components configured to determine a targeted adjustment to the supply voltage based at least in part on a signal correlated to an amplified output signal. In some embodiments, the smart DC-DC converter 520 is configured to receive a voltage from a voltage source (e.g., a battery) and to adjust that voltage to be the targeted supply voltage, the target supply voltage varying with an envelope or an average power of the signal to be amplified and also varying with the amount of information in the signal (e.g., the number of resource blocks). In certain embodiments, the smart DC-DC converter 520 includes the voltage source. The smart DC-DC converter 520 can include components such as detectors, filters, processors, data stores, and the like configured to determine an estimate of the number of resource blocks in the signal to be transmitted, examples of which are described in greater detail herein. Accordingly, the smart DC-DC converter 520 may be designated as "smart" because it is configured to process signals and to adjust a control voltage (Vref) to achieve a targeted supply voltage (Vcc) to provide to an amplifier 517.

The power amplification configuration 510, like the power amplification configuration 400 described herein with reference to FIG. 4, includes an amplifier 517 and a controller 511. The amplifier 517 is configured to receive an input signal and to generate an output signal that is an amplified form of the input signal. The amplifier 517 includes a voltage port configured to receive a supply voltage (Vcc) to provide power to the amplifier, an input port configured to receive an input signal to be amplified, and an output port configured to provide an amplified output signal. The controller 511 is configured to control operation of the amplifier 517. In some embodiments, the controller is configured to provide a biasing current to the amplifier 517. The power amplification configuration 510 includes a coupler 530 configured to generate a coupler signal that is correlated with the amplified output signal.

The smart DC-DC converter 520 includes a reference port to receive a reference voltage (Vref), a coupler port to receive the coupler signal, and a supply port to provide the supply voltage (Vcc) to the signal amplifier 517. The smart DC-DC converter 520 is configured to modify the reference voltage based at least in part on an estimate of the number of resource blocks in the amplified output signal to provide a targeted supply voltage to the signal amplifier 517. The smart DC-DC converter 520 is configured to estimate the number of resource blocks using the coupler signal. For example, the smart DC-DC converter 520 can include one or more circuits or components configured to filter the coupler signal and to determine the RMS value of the filtered signal. The RMS value of the filtered signal is correlated to the number of resource blocks in the signal.

Based at least in part on the RMS value of the filtered signal, the smart DC-DC converter 520 generates an adjustment voltage to be applied to the reference voltage. The combination of the reference voltage and the adjustment voltage results in an adjusted reference voltage. The adjusted reference voltage can then be used to adjust the supply voltage provided to the amplifier 517. In some embodiments, the smart DC-DC converter 520 includes a DC-DC converter that provides an output voltage based on a control voltage. Accordingly, the smart DC-DC converter 520 can be configured to adjust the control voltage provided to the DC-DC converter. The adjustment to the control voltage can be configured to be combined with the control voltage, resulting in an adjusted control voltage, that is provided to the DC-DC converter. This allows the smart DC-DC converter 520 to be implemented in a system that uses a power management system (e.g., an APT system) without requiring significant modifications to be made to that power management system. In addition, implementing the smart DC-DC converter 520 in an amplification architecture with an existing power management system can improve the efficiency of the amplification architecture with little or no modification to the power management system.

The smart DC-DC converter 520 can be configured to provide supply voltages at discrete voltage levels or continuous voltage levels. In some embodiments, the power supply control signal (Vref) is configured to cause a voltage converter that is part of the smart DC-DC converter 520 to provide supply voltages at discrete voltage levels. In such embodiments, the smart DC-DC converter 520 can be configured to adjust the power supply control signal (Vref) resulting in the converter providing discrete or continuous voltage levels, providing additional voltage values for the supply voltage than would be provided absent the modification or adjustment to the power supply control signal provided by the smart DC-DC converter 520.

Figure 6:
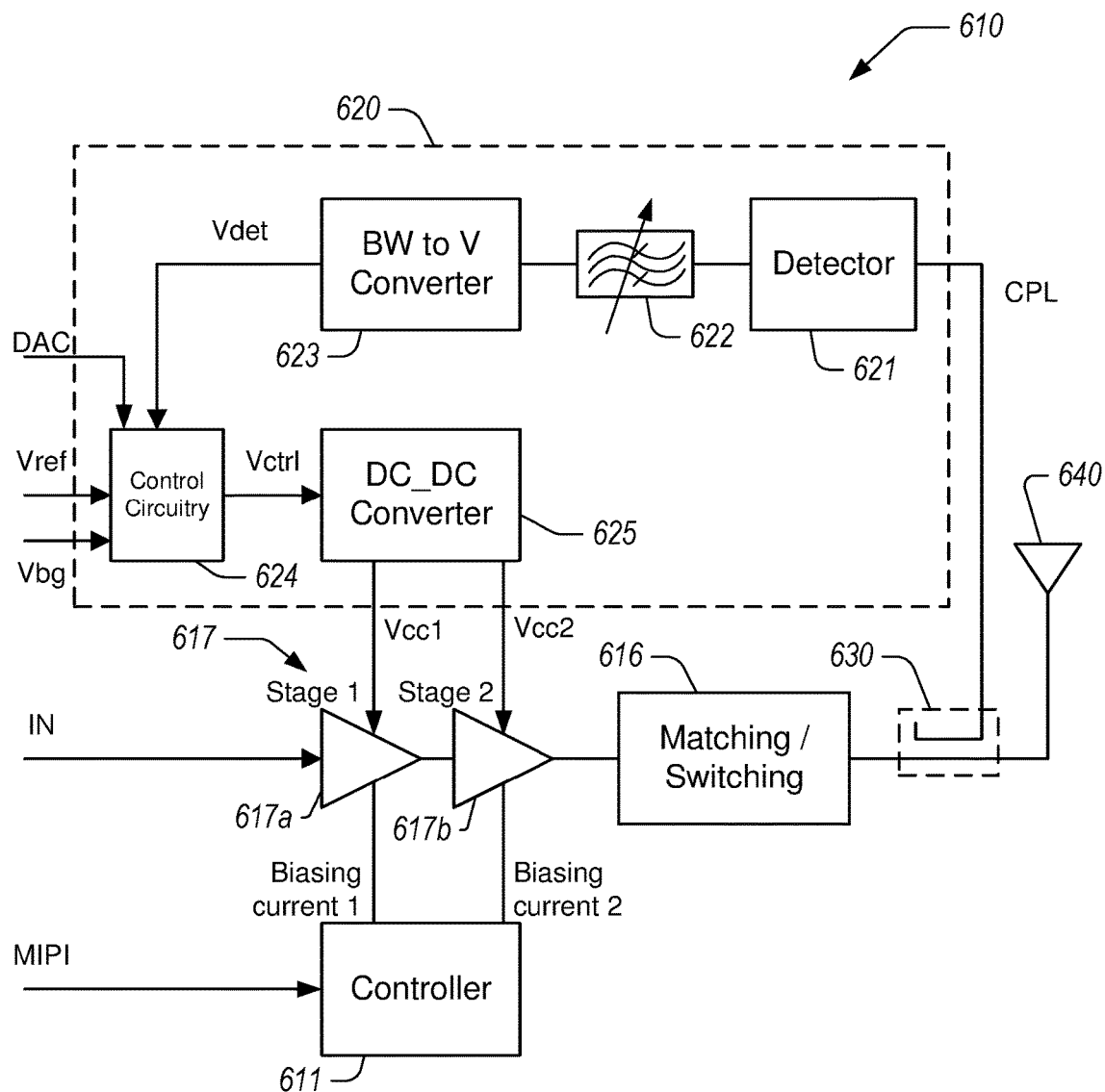
FIG. 6 illustrates an example amplification system that includes a controller, a two-stage amplifier, and a supply voltage system configured to provide supply voltages to respective stages of the amplifier.

FIG. 6 illustrates an example amplification system 610 that includes a controller 611, a two-stage amplifier 617, and a supply voltage system 620 configured to provide supply voltages (Vcc1, Vcc2) to the respective stages of the amplifier 617. The two-stage amplifier 617 includes a first amplifier stage 617a and a second amplifier stage 617b that, in combination, receive an input signal and generate an output signal that is an amplified version of the input signal. The controller 611 can be configured to receive a control signal (e.g., a signal that conforms to the Mobile Industry Processor Interface or MIPI® standard) and control the two-stage amplifier 617 using enable signals and/or bias signals (e.g., biasing current 1 for the first amplifier stage 617a and biasing current 2 for the second amplifier stage 617b).

The amplification system 610 also includes a matching or switching network 616 configured to provide impedance matching, antenna switching, and the like. The amplified signal can be passed through the matching network 616 to an antenna 640 for transmission. The amplification system 610 also includes a coupler 630 configured to generate a coupler signal (CPL) that is correlated to the amplified output signal to be transmitted with the antenna 640.

The supply voltage system 620 is configured to receive a power supply control signal (Vref) that indicates a targeted supply voltage to provide to the amplifier 617. The power supply control signal is configured to control a DC-DC converter 625 within the supply voltage system 620. The supply voltage system 620 is configured to modify the power supply control signal prior to that signal being received by the DC-DC converter 625. In this way, the supply voltage system 620 is configured to adjust the power supply control signal based at least in part on characteristics of the amplified signal, such as the number of resource blocks in the signal.

In some embodiments, the power supply control signal (Vref) is the main control for the DC-DC converter 625 and can be provided by a power management system such as an APT system or ET system. The supply voltage system 620 receives the power supply control signal and modifies it so that the DC-DC converter 625 provides an adjusted targeted supply voltage to the amplifier 617. In this way, the supply voltage system 620 is configured to provide enhanced efficiency in addition to improved efficiency provided by the power management system generating the power supply control signal.

The supply voltage system 620 includes a detector 621, a tunable filter 622, and a bandwidth to voltage conversion module 623 that, in combination, generate a voltage (Vdet) correlated with the amount of information in the signal to be transmitted. The generated voltage can be provided to control circuitry 624 that is configured to adjust the power supply control signal based on the amount of information in the signal, resulting in a modified control signal (Vctrl) to control the DC-DC converter 625. The supply voltage system 620 is configured to receive the coupler signal (CPL) from the coupler 630 and to pass that signal to the detector 621. The detector 621 is configured to generate a detector signal that is passed to the tunable filter 622. The output of the combination of the detector 621 and the filter 622 is a bandwidth signal indicative of a bandwidth of the amplified output signal. The conversion module 623 receives the bandwidth signal from the filter 622 and generates a bandwidth voltage (Vdet) that corresponds to the bandwidth of the signal. In some embodiments, the bandwidth of the signal includes the number of resource blocks in the signal. The conversion module 625 can be configured to output discrete voltages or the voltages can be continuous.

The bandwidth voltage (Vdet) is passed to the control circuitry 624 that is configured to adjust the power supply control signal (Vref) based on the bandwidth voltage and to output a modified power supply control signal (Vctrl). The control circuitry 624 receives a supply voltage (Vbg) and control signal (DAC) configured to control operation of the control circuitry, as described herein with reference to FIG. 11. The control circuitry 624 can include any circuitry, components, or device configured to combine the power supply control signal and the bandwidth voltage in any suitable way, such as by adding the signals, subtracting the signals, or using any other linear or non-linear function to combine the signals. In some embodiments, the control circuitry 624 combines the power supply control signal and the bandwidth voltage using a look-up table that associates two inputs (Vref, Vdet) and a targeted output (Vctrl). The control circuitry 624 can be configured to output discrete voltages (e.g., voltages that have a limited number of values within a particular range) or continuous voltages (e.g., voltages that can take any value within a particular range). The modified power supply control signal is provided to the DC-DC converter 625 to control the DC-DC converter to provide targeted supply voltages (Vcc1, Vcc2) to the respective stages of the amplifier 617.

The DC-DC converter 625 is configured to receive the modified power supply control signal (Vctrl) and a voltage from a battery or other voltage source and to generate supply voltages for the amplifier 617. As illustrated, the DC-DC converter 625 generates a first supply voltage for the first amplifier stage 617a and a second supply voltage for the second amplifier stage 617b. However, the DC-DC converter 625 can be configured to generate a single supply voltage for one or more stages of the amplifier 617 or the DC-DC converter 625 can be configured to generate a plurality of supply voltages for two or more stages of an amplifier coupled to the DC-DC converter 625.

Figure 7:
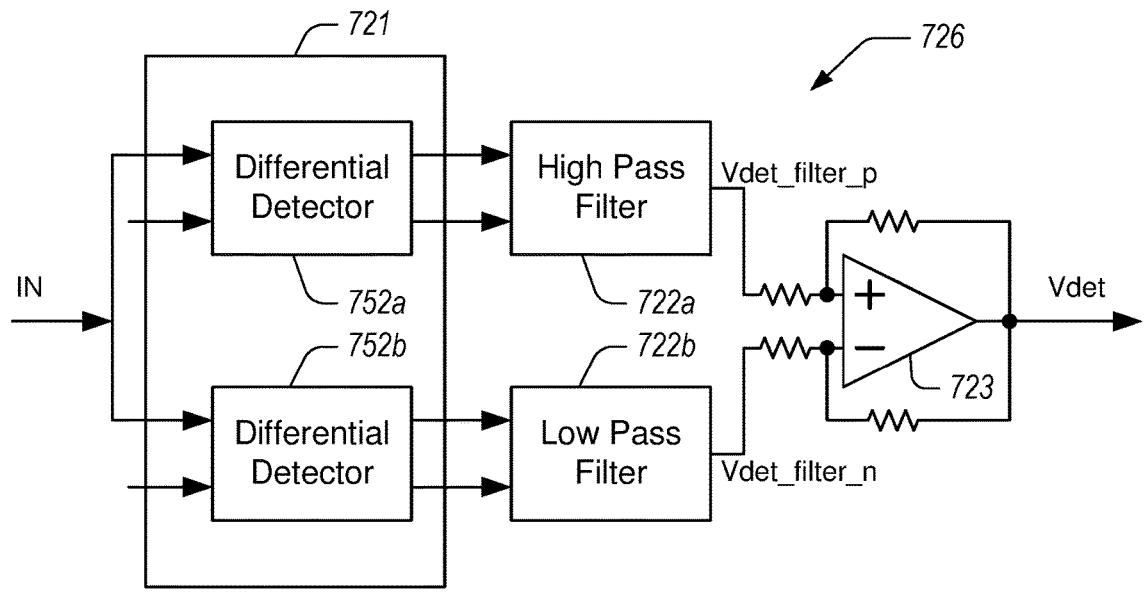
FIG. 7 illustrates example detector and conversion circuitry configured to generate a signal correlated with the bandwidth of an input signal.

FIG. 7 illustrates example detector and conversion circuitry 726 configured to generate a signal correlated with the bandwidth of an input signal. The detector and conversion circuitry 726 is configured to detect a difference between a modulated signal with different baseband bandwidths. The circuitry 726 includes a differential detector system 721 (e.g., the detector circuit 621 described herein with reference to FIG. 6) that receives an input signal (e.g., the coupler signal (CPL) described herein with reference to FIG. 6) and directs the input signal to differential detectors 752a, 752b.

The differential detectors 752a, 752b are respectively coupled to a high pass filter 722a and a low pass filter 722b (e.g., the tunable filter 622 described herein with reference to FIG. 6). In some embodiments, the high pass filter 722a and/or the low pass filter 722b are tunable. For example, the high pass filter 722a and/or the low pass filter 722b includes a tunable capacitor in series with a resistor coupled to a reference node (e.g., a ground potential node). The high pass filter 722a provides a first signal, Vdet_filter_p, and the low pass filter 722b provides a second signal, Vdet_filter_n.

The respective output of the filters 722a, 722b is provided to a conversion circuit 723 (e.g., the conversion module 623 described herein with reference to FIG. 6) that generates an output signal (Vdet) associated with the bandwidth of the input signal. Accordingly, the detector and conversion circuitry 726 is configured to provide a signal indicative of the bandwidth of the input signal (e.g., a signal for amplification in an amplification system). In some embodiments, the detector and conversion circuitry 726 outputs a value correlated to the RMS value of the signal, that value associated with the number of resource blocks in the signal.

Figure 8:
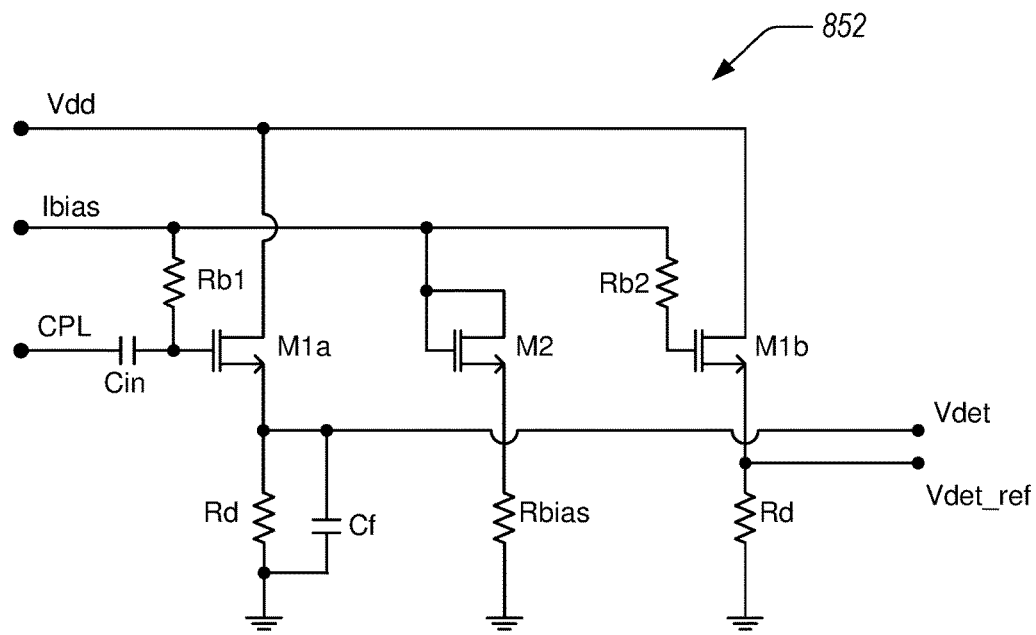
FIG. 8 illustrates an example differential detector circuit, such as the differential detectors of FIG. 7.

FIG. 8 illustrates an example differential detector circuit 852, such as the differential detectors 752a, 752b described herein with reference to FIG. 7. The differential detector circuit 852 includes a supply port configured to receive a supply voltage (Vdd) such as from a battery or other voltage source. The differential detector circuit 852 includes a bias port configured to receive a bias current (Ibias) for the transistors M1a, M1b, and M2. The differential detector circuit 852 includes a signal port configured to receive a signal (e.g., the signal CPL from a coupler, as described herein with reference to FIG. 6) for detection. The differential detector circuit 852 includes an output port configured to provide a detection signal (Vdet). The differential detector circuit 852 can be configured to generate a signal indicative of the RMS value of the signal to be amplified in an amplification architecture.

The differential detector circuit 852 includes biasing resistors Rb1, Rb2 that are respectively coupled to the gates of transistors M1a, M1b and to the bias port. The gate of the transistor M2 is coupled to the bias port. The drains of transistors M1a, M1b are coupled to the supply port and the drain of the transistor M2 is coupled to its base (e.g., the bias port). The sources of the transistors M1a, M1b are respectively coupled to reference potential nodes through resistors Rd (having the same value). The source of the transistor M2 is coupled to a reference potential node through a resistor Rbias. The sources of the transistors M1a, M1b are also coupled to different nodes of the output port, providing a detector signal (Vdet) and a reference detector signal (Vdet_ref). In addition, the differential detector circuit 852 includes a capacitor Cf in parallel with the resistor Rd coupled to the source of transistor M1a.

Figure 9:
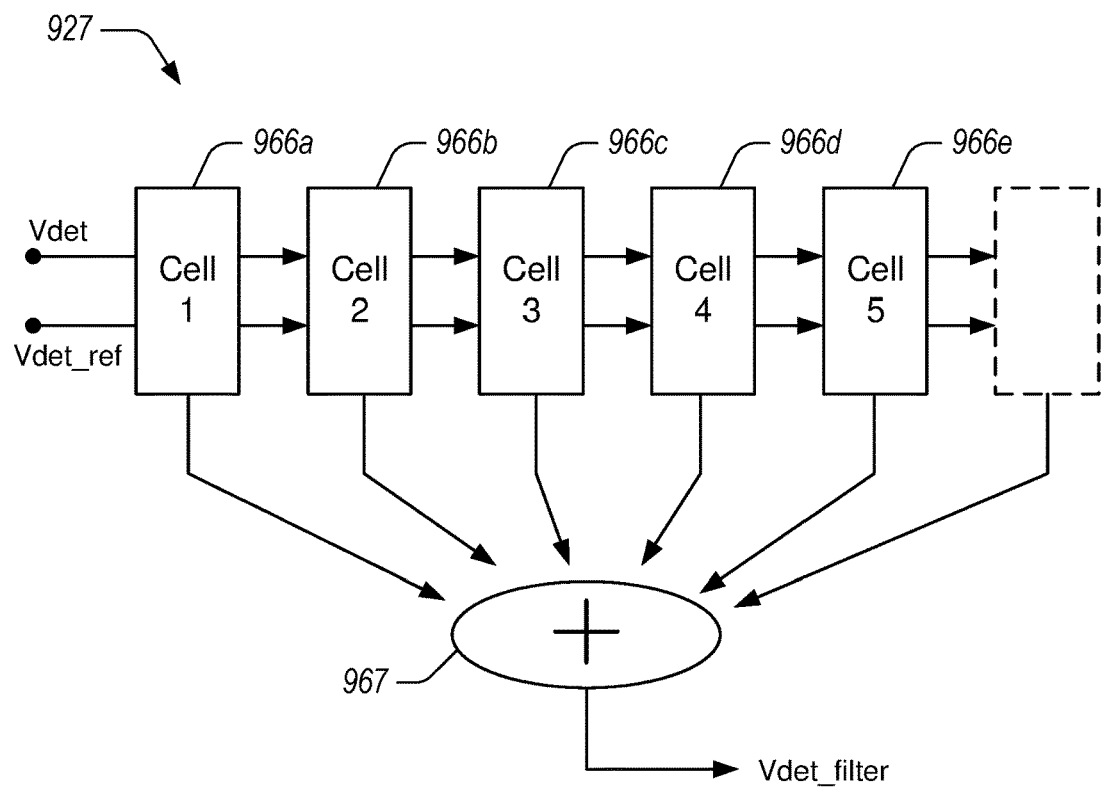
FIG. 9 illustrates a block diagram of a linearization circuit that can be part of any of the detector circuits described herein.

FIG. 9 illustrates a block diagram of a linearization circuit 927 that can be part of any of the detector circuits described herein. The linearization circuit 927 is configured to receive a detection signal (e.g., a signal indicative of the RMS value of the signal to be amplified in an amplification architecture) and a reference detection signal (Vdet_ref) and to output a baseband detector signal (Vdet_filter) that is linear in decibels (dB). The linearization circuit 927 includes a plurality of cells 966a-966e that can be combined by a combiner component 967 to linearize the input detector signal (Vdet).

The linearization circuit 927 provides a baseband linearity conversion. The linearization circuit 927 is configured to generate an output signal that is correlated with the bandwidth (e.g., resource blocks) of a signal within a detection circuit, such as the detector 621 or the detector circuit 721 described herein with reference to FIGS. 6 and 7, respectively. For example, the linearization circuit 927 can be a sub-circuit of a detector or detector circuit.

Figure 10:
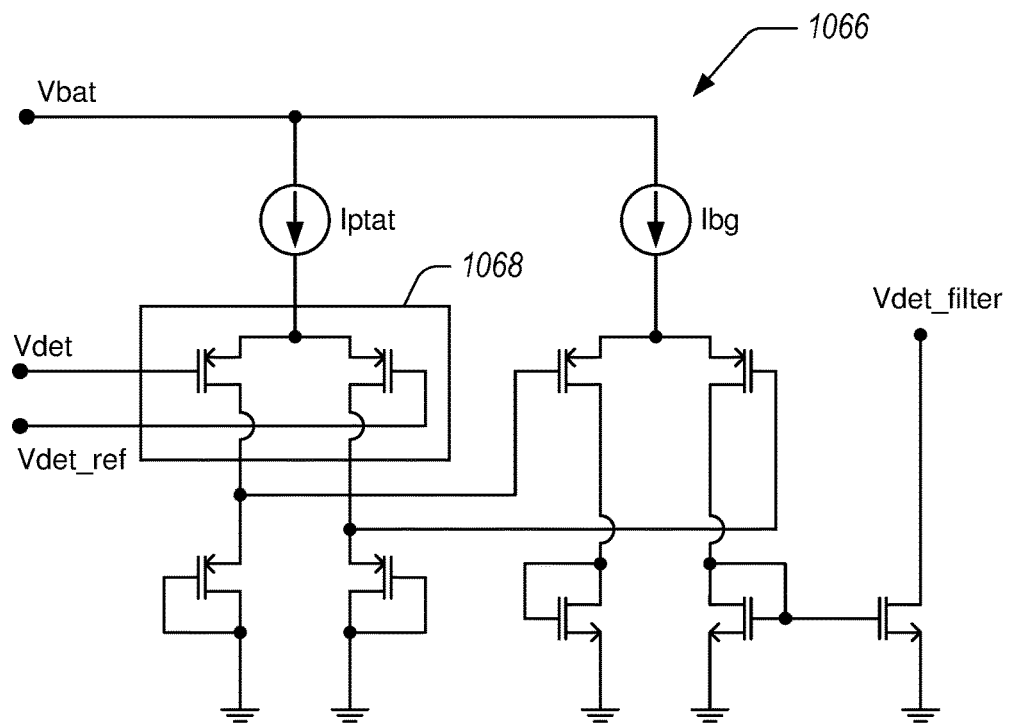
FIG. 10 illustrates a structure of a cell that is used in a linearization circuit, such as the linearization circuit of FIG. 9.

FIG. 10 illustrates a structure of a cell 1066 that is used in a linearization circuit, such as the linearization circuit 923 described herein with reference to FIG. 9. The cell 1066 includes a baseband processing component 1068, current sources Iptat and Ibg, a supply port to receive a supply voltage (Vbat), a signal port to receive a detector signal (Vdet), and a reference port to receive a reference voltage (Vdet_ref). The cell 1066 outputs a detector filter signal (Vdet_filter) that can be combined with signals from other cells to generate a baseband detector signal that is linear in decibels, as described herein.

Figure 11:
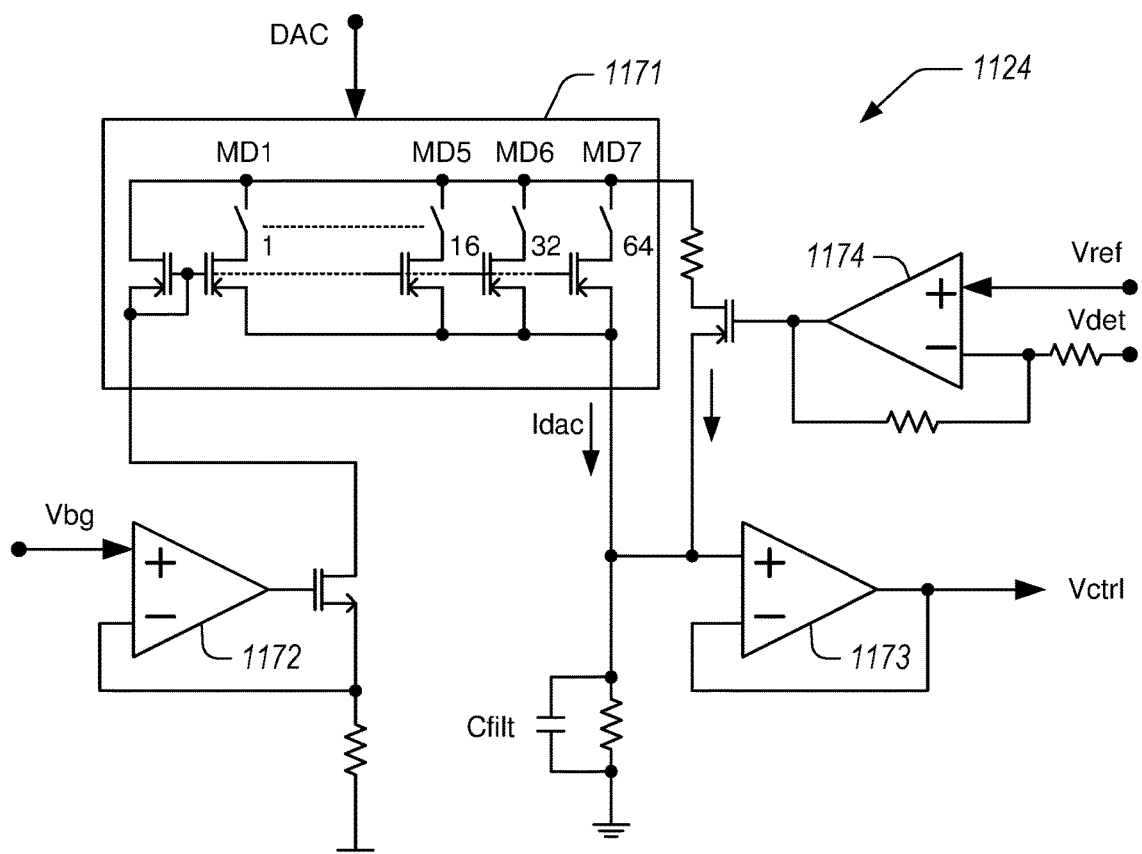
FIG. 11 illustrates an example control circuit that includes circuitry to select a switch and power amplifier path based at least in part on spectrum bandwidth.

FIG. 11 illustrates an example control circuit 1124 that includes circuitry to select a switch and power amplifier path based at least in part on spectrum bandwidth. The control circuit 1124 can be configured to be part of the supply voltage system 620 described herein with reference to FIG. 6. The control circuit 1124 includes a DAC module 1171 configured to receive a DAC signal to select a targeted path. The control circuit 1124 is configured to combine the detected voltage (Vdet) and the current from the DAC module 1171. This current is converted into a voltage (Vctrl) that is used to control a DC-DC converter.

FIGS. 12A-12F illustrate graphs of simulations of detected RF signals (i.e., plots 1205a-f) and baseband signals (i.e., plots 1210a-f). The detected RF signals can be the signals produced by the detectors, detector circuits, and/or filters described herein with reference to FIGS. 6-10. The graphs demonstrate a monotonic relationship between the number of resource blocks and the RMS value of the detected signal. For example, the variation in the signal (e.g., RMS value) increases with increasing number of resource blocks in the signal. Accordingly, a relationship can be determined between the determined RMS value and an estimate of the number of resource blocks in the signal.

Figure 12A:
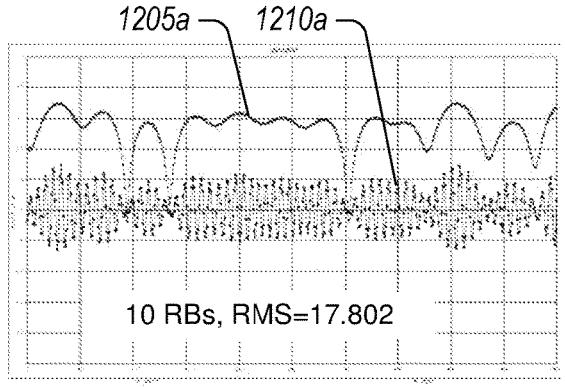
FIGS. 12A, 12B, 12C, 12D, 12E, and 12F illustrate graphs of simulations of detected RF signals and baseband signals.
Figure 12B:
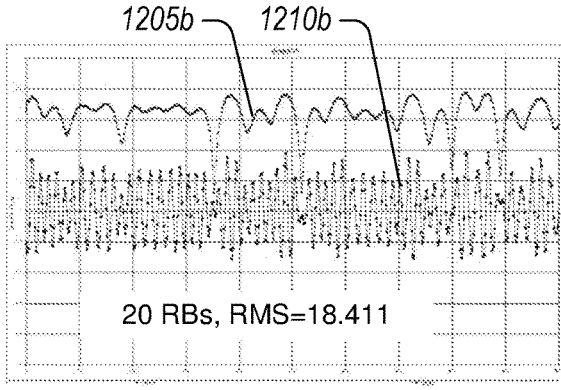
Figure 12C:
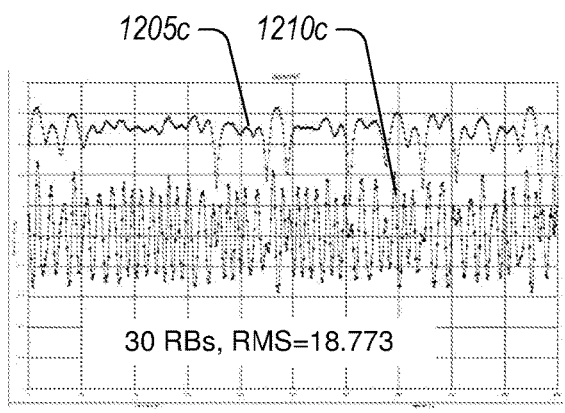
Figure 12D:
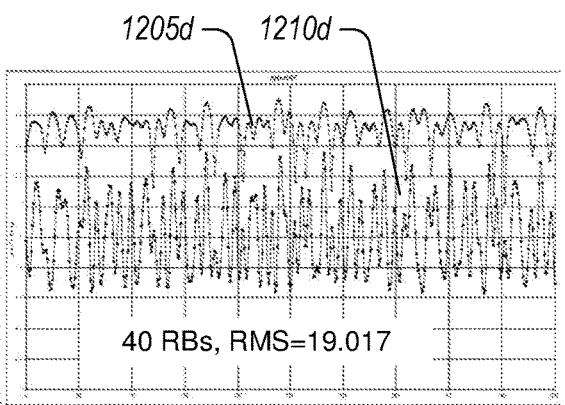
Figure 12E:
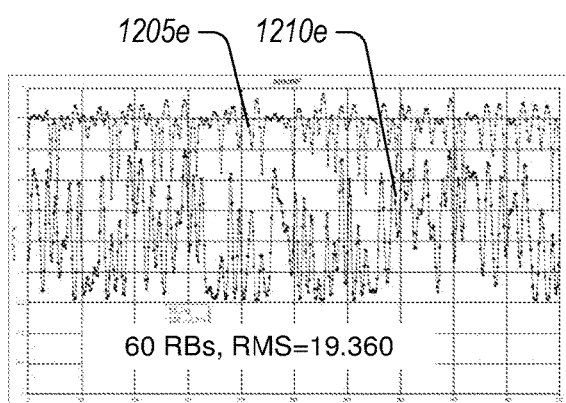
Figure 12F:
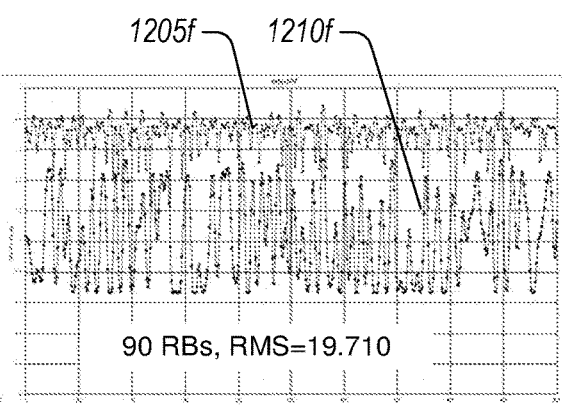

In the graphs, the x-axis is time and the y-axis is signal amplitude (in arbitrary units). For each graph, the number of resource blocks in the signal (i.e., plots 1210a-f) is given along with the RMS value determined from the detected RF signals (i.e., plots 1205a-f). In FIG. 12A, the baseband signal 1210a includes 10 resource blocks and the detected signal 1205a has an RMS value of 17.802. In FIG. 12B, the baseband signal 1210b includes 20 resource blocks and the detected signal 1205b has an RMS value of 18.411. In FIG. 12C, the baseband signal 1210c includes 30 resource blocks and the detected signal 1205c has an RMS value of 18.773. In FIG. 12D, the baseband signal 1210d includes 40 resource blocks and the detected signal 1205d has an RMS value of 19.017. In FIG. 12E, the baseband signal 1210e includes 60 resource blocks and the detected signal 1205e has an RMS value of 19.360. In FIG. 12F, the baseband signal 1210f includes 90 resource blocks and the detected signal 1205f has an RMS value of 19.710.

Figure 13A:
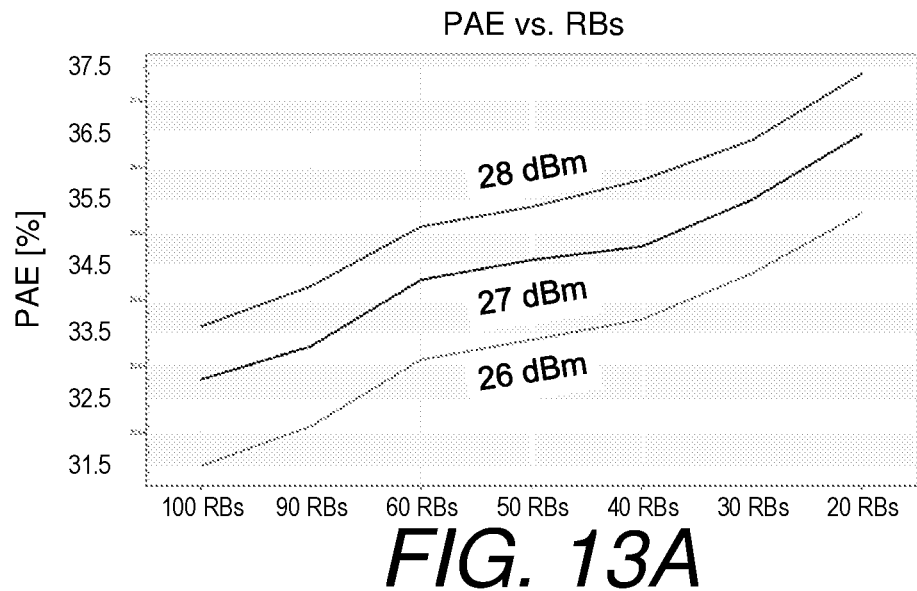
FIGS. 13A and 13B illustrate improvements in performance when the technologies described herein are implemented in an amplifier system.
Figure 13B:
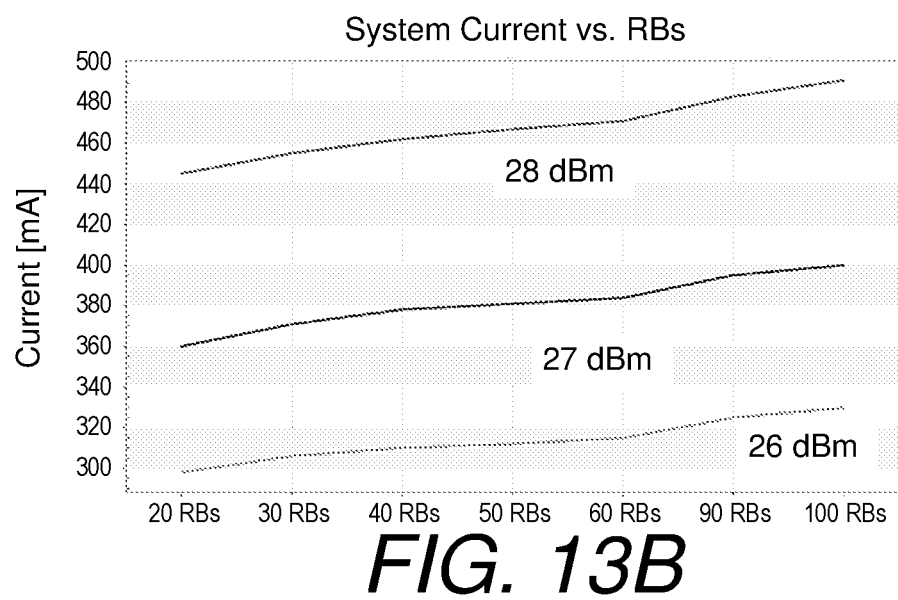

FIGS. 13A and 13B illustrate improvements in performance when the technologies described herein are implemented in an amplifier system. In each of FIGS. 13A and 13B, three power loads (i.e., 26 dBm, 27 dBm, and 28 dBm) are used to demonstrate the effects of changing the power supplied to a power amplifier as a function of the number of resource blocks in the signal being amplified. The x-axis in each graph is the number of resource blocks. In FIG. 13A, the number of resource blocks is in decreasing value from 100 RBs to 20 RBs while in FIG. 13B the number of resource blocks increases in value from 20 RBs to 100 RBs. In FIG. 13A, the y-axis is the power added efficiency (PAE) in percentage. In FIG. 13B, the y-axis is current in milliamps.

FIG. 13A illustrates that adjusting the supply voltage to an amplifier based on the number of resource blocks, as described herein, can increase the efficiency of the amplification process by around 4% (e.g., an improvement from 33.5% PAE at 100 RBs to 37.5% PAE at 20 RBs) relative to keeping the supply voltage static as a function of the number of resource blocks. FIG. 13B illustrates that adjusting the supply voltage to an amplifier based on the number of resource blocks, as described herein, can decrease system current by around 55 mA (e.g., an improvement from 495 mA at 100 RBs to 440 mA at 20 RBs) relative to keeping the supply voltage static as a function of the number of resource blocks.

Figure 14:
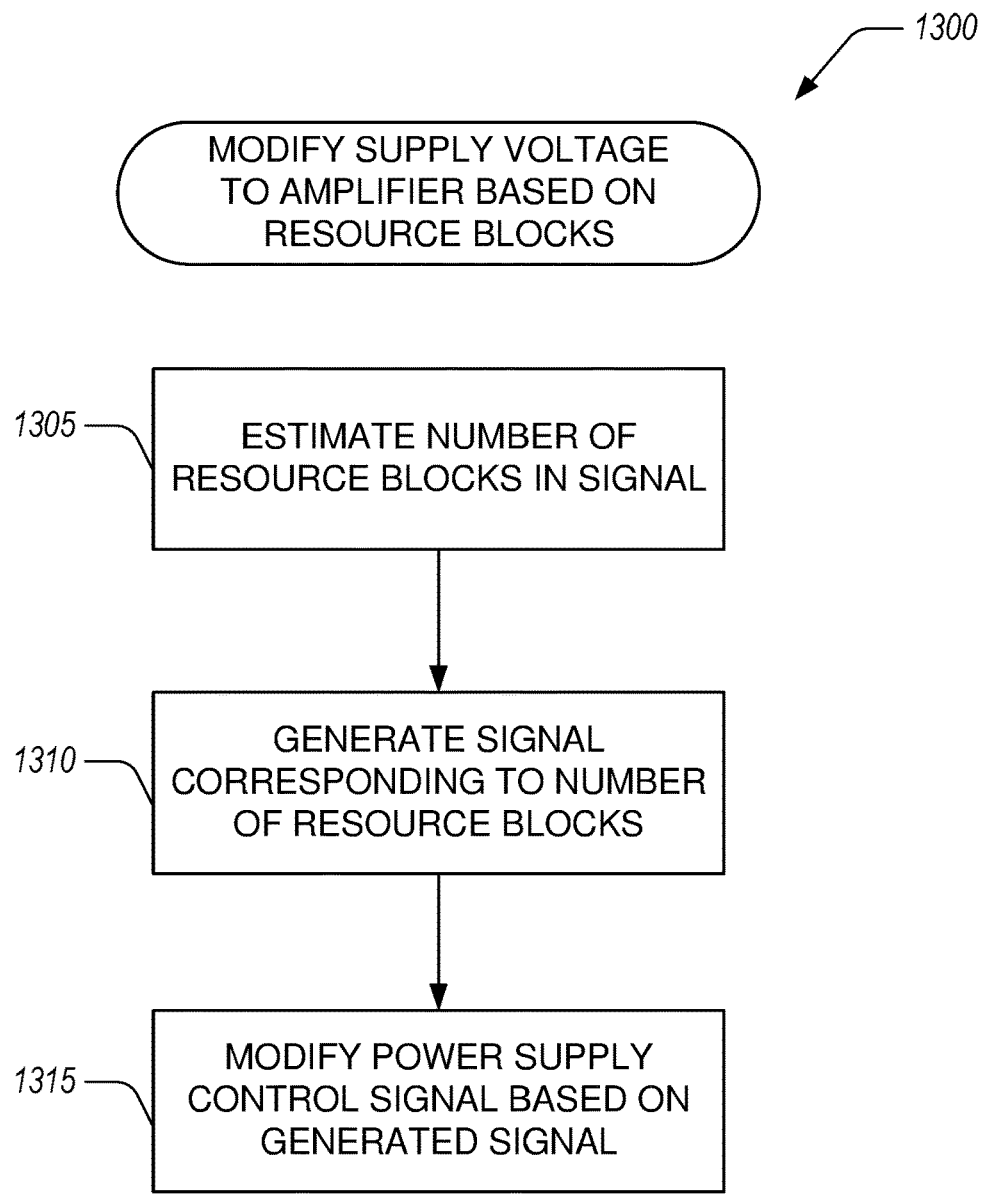
FIG. 14 illustrates a flow chart of an example method of modifying a supply voltage to an amplifier based at least in part on the number of resource blocks in a signal.

FIG. 14 illustrates a flow chart of an example method 1300 of modifying a supply voltage to an amplifier based at least in part on the number of resource blocks in a signal. The method 1300 can be performed by any suitable component in an amplification system, such as the supply adjust component 420 described herein with reference to FIG. 4, the smart DC-DC converter 520 described herein with reference to FIG. 5, or the supply voltage system 620 described herein with reference to FIG. 6. For ease of description, the method 1300 will be described as being performed by a supply voltage system, such as the supply voltage system 620 described herein with reference to FIG. 6. However, it is to be understood that any subcomponent or sub-circuit of a supply voltage system can perform any part or any number of the steps in the method 1300 and that any combination of subcomponents or sub-circuits can perform any portion of a step or any combination of steps in the method 1300.

In block 1305, a supply voltage system estimates a number of resource blocks in a signal being amplified. The supply voltage system can use a detector, filter, and related components to generate a detected signal. The supply voltage system can determine a variance, RMS value, or other indicator of the spread in the detected signal.

In block 1310, the supply voltage system generates a modification signal corresponding to the number of resource blocks estimated in block 1305. The modification signal can be a voltage that is used to adjust a voltage that acts as a power supply control signal. The modification signal can be generated by a conversion module or circuit that correlates the estimated number of resource blocks with a targeted modification to a control voltage for a DC-DC converter.

In block 1315, the supply voltage system modifies a power supply control signal for a DC-DC converter based on the modification signal generated in block 1310. In some embodiments, modifying the power supply control signal includes decreasing the power supply control signal in response to a decrease in the number of resource blocks. In certain embodiments, the supply voltage system combines the modification signal with the power supply control signal to generate an adjusted power supply control signal. In such embodiments, the supply voltage system can be configured to provide the adjusted power supply control signal to the DC-DC converter. The adjusted power supply control signal can thereby adjust the voltage supplied to the amplifier relative to a voltage supplied without use of the method 1300.

Figure 15:
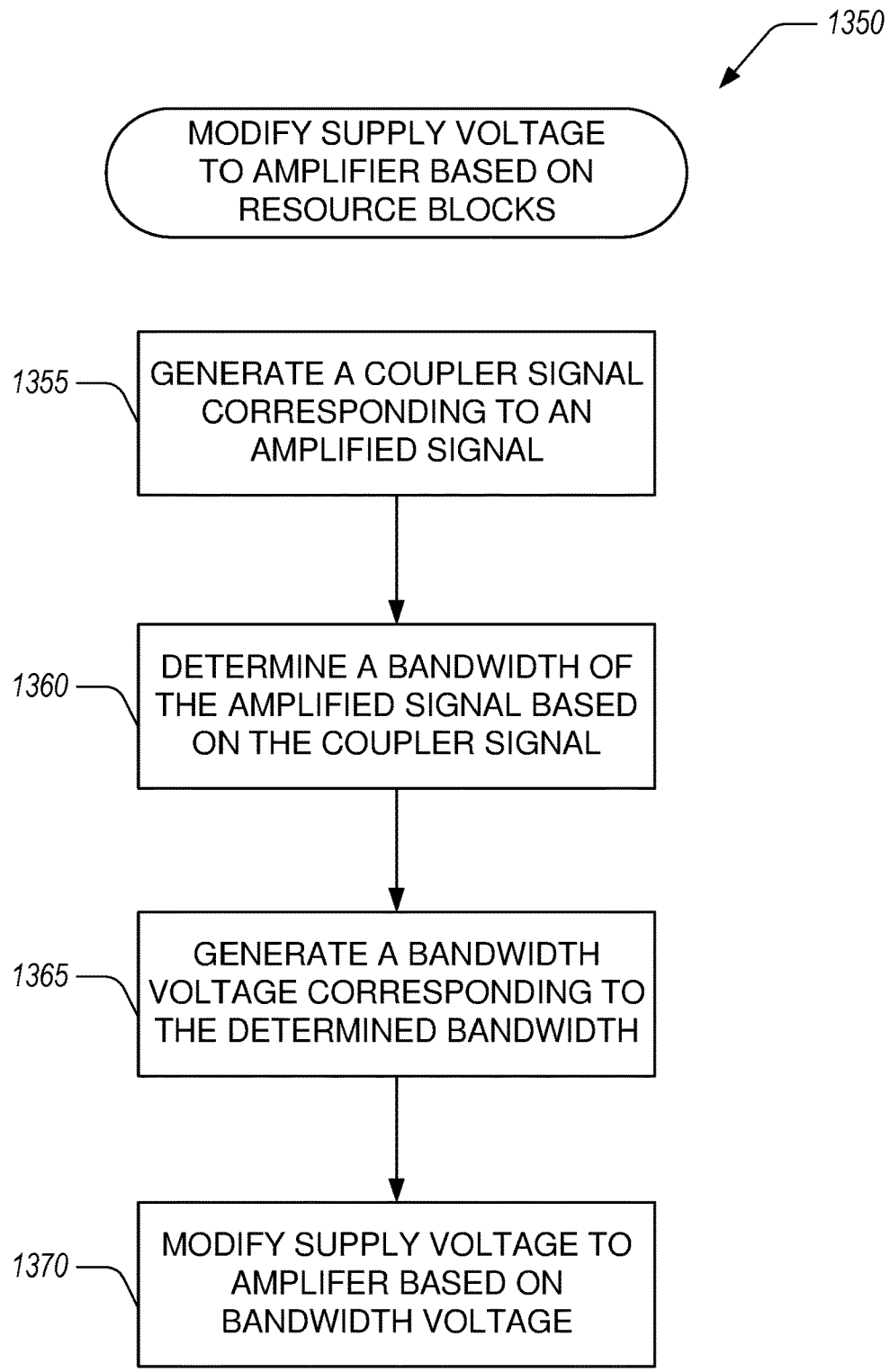
FIG. 15 illustrates a flow chart of another example method of modifying a supply voltage to an amplifier based at least in part on the number of resource blocks in a signal.

FIG. 15 illustrates a flow chart of an example method 1350 of modifying a supply voltage to an amplifier based at least in part on the number of resource blocks in a signal. As in the method 1300 described herein with reference to FIG. 14, the method 1350 can be performed by any suitable component in an amplification system, such as the supply adjust component 420 described herein with reference to FIG. 4, the smart DC-DC converter 520 described herein with reference to FIG. 5, or the supply voltage system 620 described herein with reference to FIG. 6. For ease of description, the method 1350 will be described as being performed by a supply voltage system, such as the supply voltage system 620 described herein with reference to FIG. 6. However, it is to be understood that any subcomponent or sub-circuit of a supply voltage system can perform any part or any number of the steps in the method 1350 and that any combination of subcomponents or sub-circuits can perform any portion of a step or any combination of steps in the method 1350.

In block 1355, a supply voltage system generates a coupler signal corresponding to an amplified output signal generated by an amplifier. The coupler signal can be generated by a coupler coupled to an output of the amplifier. In some embodiments, the coupler signal is correlated with an input signal to the amplifier. The coupler signal can be configured to be correlated to the signal at the amplifier such that variation in the coupler signal corresponds to variation in the signal at the amplifier.

In block 1360, the supply voltage system determines a bandwidth of the amplified output signal based at least in part on the coupler signal. The supply voltage system can include a detector circuit and filter that are configured to generate a bandwidth signal correlated with the bandwidth of the coupler signal. The bandwidth signal can be associated with an RMS value of the coupler signal, and thereby with an RMS value of the signal at the amplifier. In some embodiments, the bandwidth of the signal includes the number of resource blocks in the signal.

In block 1365, the supply voltage system generates a bandwidth voltage corresponding to a number of resource blocks in the amplified output signal, the number of resource blocks calculated based at least in part on the determined bandwidth. The supply voltage system can include a conversion module that is configured to receive a signal indicative of the bandwidth determined in block 1360 and to generate the bandwidth voltage. The bandwidth voltage can be configured to be an adjustment to a control voltage for a DC-DC converter.

In block 1370, the supply voltage system modifies a supply voltage to the amplifier based at least in part on the bandwidth voltage. In some embodiments, the supply voltage system decreases the supply voltage in response to a decrease in the number of resource blocks. In some embodiments, the supply voltage system also receives a reference voltage from a power supply control system, wherein the reference voltage is combined with the bandwidth voltage to modify the supply voltage provided to the power amplifier system.

Examples Related to Implementations in Products

Figure 16:
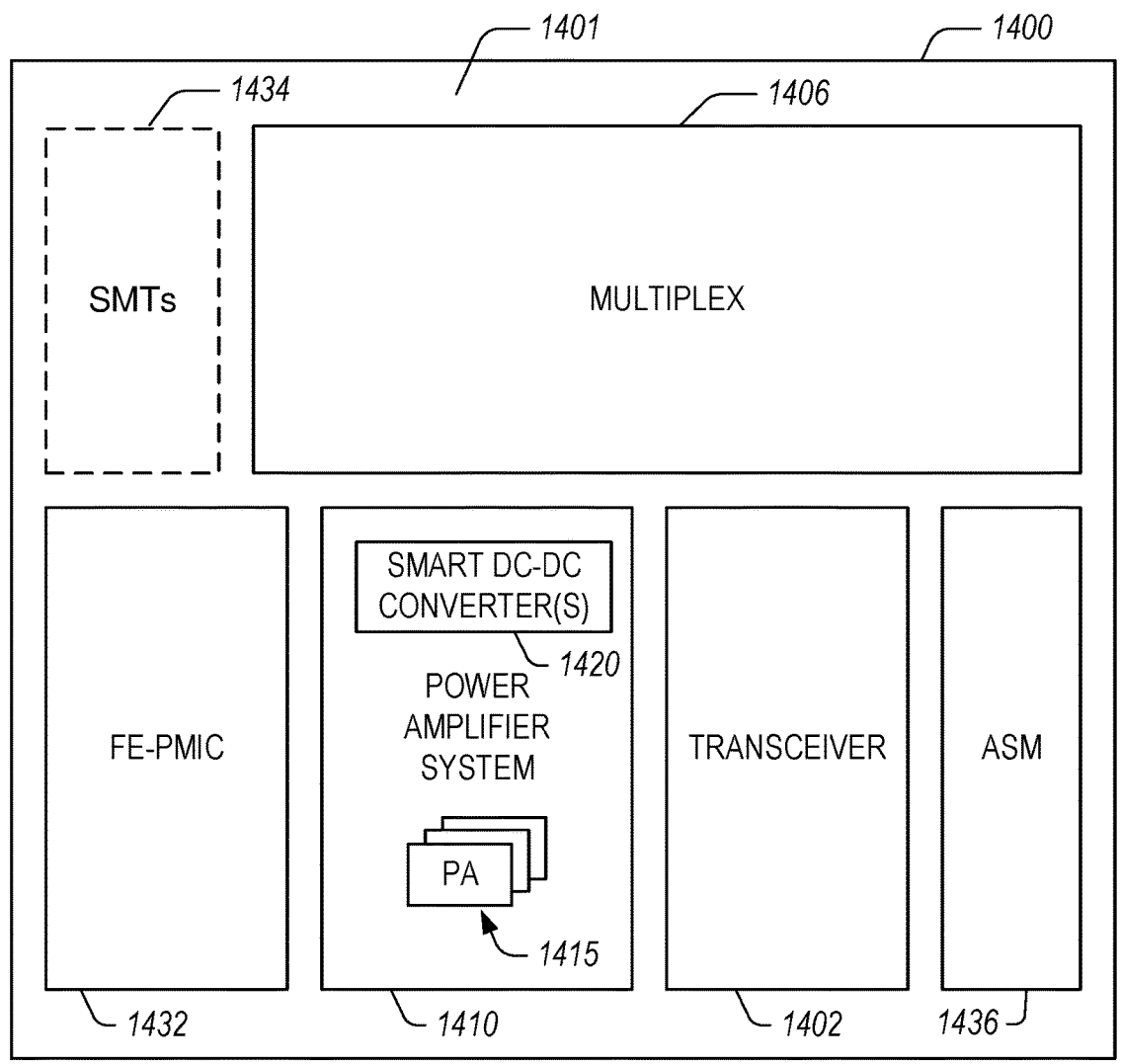
FIG. 16 illustrates that in some embodiments, some or all the wireless communications configurations disclosed herein can be implemented, wholly or partially, in a module.

FIG. 16 illustrates that in some embodiments, some or all the wireless communications configurations disclosed herein (e.g., those described with reference to FIGS. 1-11) can be implemented, wholly or partially, in a module. Such a module can be, for example, a front-end module (FEM). In the example of FIG. 16, a module 1400 can include a packaging substrate 1401, and a number of components can be mounted on such a packaging substrate 1401. For example, an FE-PMIC component 1432, a power amplifier system 1410 which includes one or more PAs 1415 (examples of which are described herein with reference to FIGS. 1-11), a transceiver 1402, and a multiplexer assembly 1406 can be mounted and/or implemented on and/or within the packaging substrate 1401. Other components such as a number of SMT devices 1434 and an antenna switch module (ASM) 1436 can also be mounted on the packaging substrate 1401. Although all of the various components are depicted as being laid out on the packaging substrate 1401, it will be understood that some component(s) can be implemented over other component(s). The power amplifier system 1410 can include one or more smart DC-DC converters 1420 that are configured to dynamically adjust the power supplied to the PAs 1415 based on a bandwidth (e.g., number of resource blocks) in signals passing through the PAs 1415, as described herein.

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 17:
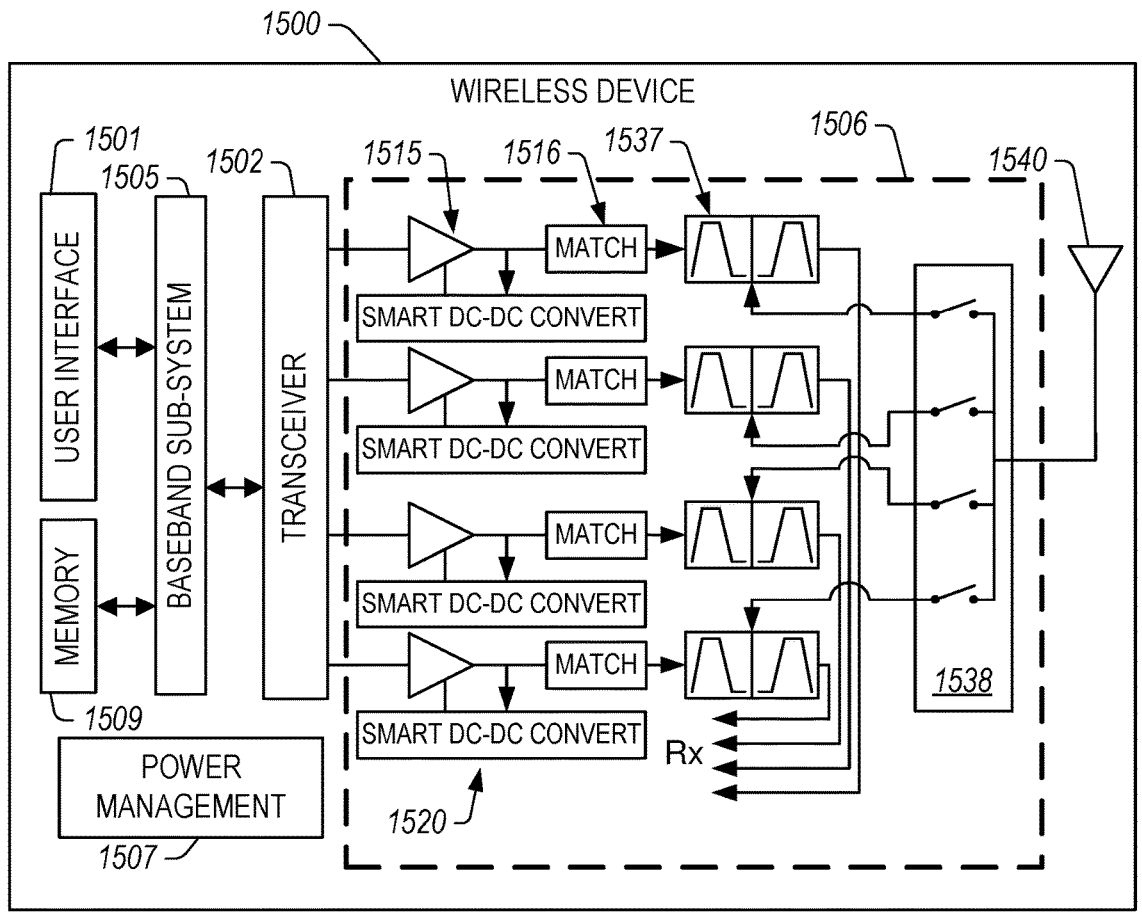
FIG. 17 illustrates an example wireless device having one or more advantageous features described herein.

FIG. 17 illustrates an example wireless device 1500 having one or more advantageous features described herein. In the context of a module having one or more features as described herein, such a module can be generally depicted by a dashed box 1506, and can be implemented as, for example, a front-end module (FEM) coupled to an antenna 1540 and a transceiver 1502.

The wireless device 1500 can include power amplifiers (PAs) 1515 that receive their respective RF signals from the transceiver 1502, the transceiver 1502 being configured and operated in known manners to generate RF signals to be amplified and transmitted, and to process received signals. The transceiver 1502 is shown to interact with a baseband sub-system 1505 that is configured to provide conversion between data and/or voice signals suitable for a user and RF signals suitable for the transceiver 1502. The transceiver 1502 can also be in communication with a power management component 1507 that is configured to manage power for the operation of the wireless device 1500. Such power management can also control operations of the baseband sub-system 1505 and the module 1506.

The baseband sub-system 1505 is shown to be connected to a user interface 1501 to facilitate various input and output of voice and/or data provided to and received from the user. The baseband sub-system 1505 can also be connected to a memory 1509 that is configured to store data and/or instructions to facilitate the operation of the wireless device, and/or to provide storage of information for the user.

In the example wireless device 1500, outputs of the PAs are shown to be matched (via respective output match circuits 1516) and routed to their respective diplexers 1537. Such amplified and filtered signals can be routed to an antenna 1540 (or multiple antennas) through an antenna switch 1538 for transmission. In some embodiments, the diplexers 1537 can allow transmit and receive operations to be performed simultaneously using a common antenna (e.g., antenna 1540). Received signals are shown to be routed to "Rx" paths (not shown) that can include, for example, a low-noise amplifier (LNA). In some implementations, the receive paths also include one or more filters (not shown).

The wireless device 1500 includes a plurality of PAs 1515 each coupled to a smart DC-DC converter 1520. In some embodiments, a single DC-DC converter can be used for multiple PAs 1415. The smart DC-DC converters 1520 can be configured to dynamically adjust the power supplied to the PAs 1515 based on a bandwidth (e.g., number of resource blocks) in signals passing through the PAs 1515, as described herein. The smart DC-DC converters 1520 can be configured as described herein with reference to FIGS. 4-11 and can perform the methods described herein with reference to FIGS. 13 and 14. For example, the smart DC-DC converters 1520 can include one or more components configured to calculate an estimate of a number of resource blocks in the signals amplified by the amplifiers 1515. Based on this estimate, the smart DC-DC converters 1520 can be configured to adjust power supplied to the PAs 1515. Such a configuration can be implemented in a wireless device with a power management system for the amplification process that uses average power tracking or envelope tracking and can provide improved performance to such wireless devices.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure.

The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A signal amplifier architecture for amplifying a cellular signal, the signal amplifier architecture comprising:
   an amplifier having a voltage port, an input port, and an output port, the amplifier configured to receive a supply voltage at the voltage port to provide power to the amplifier, to receive an input signal at the input port, and to provide an amplified output signal at the output port; and
   a DC-DC converter having a reference port to receive a reference voltage, a coupler port to receive a coupler signal that is correlated to the amplified output signal, a supply port to provide the supply voltage to the amplifier, and a detector and a filter that are configured to generate a bandwidth signal indicative of a bandwidth of the amplified output signal, the DC-DC converter including one or more components configured to modify the reference voltage to provide a targeted supply voltage to the amplifier based at least in part on an estimate of a number of resource blocks in the amplified output signal.

2. The signal amplifier architecture of claim 1 wherein the estimate of the number of resource blocks is determined based at least in part on the coupler signal.

3. The signal amplifier architecture of claim 2 further comprising a coupler coupled to the output port of the amplifier, the coupler configured to generate the coupler signal.

4. The signal amplifier architecture of claim 1 further comprising a controller configured to provide a biasing current to the amplifier.

5. The signal amplifier architecture of claim 1 wherein the amplifier includes a first stage coupled to the input port and a second stage coupled to the output port.

6. The signal amplifier architecture of claim 5 wherein the supply voltage is provided to the first stage and to the second stage.

7. The signal amplifier of claim 1 wherein the DC-DC converter further includes a conversion module configured to receive the bandwidth signal and to generate a modification voltage that corresponds to the bandwidth based on the bandwidth signal.

8. The signal amplifier of claim 7 wherein the DC-DC converter further includes an addition component configured to generate a DC control voltage by combining the reference voltage and the modification voltage, the supply voltage provided by the DC-DC converter corresponding to the resulting DC control voltage.

9. The signal amplifier of claim 7 wherein the conversion module includes a plurality of cells and the output of individual cells of the plurality of cells is combined to generate the modification voltage.

10. The signal amplifier of claim 1 wherein the detector includes a first differential detector and a second differential detector and the filter includes at least a high pass filter coupled to the first differential detector and a low pass filter coupled to the second differential detector.

11. The signal amplifier of claim 1 wherein the DC-DC converter is implemented in an average power tracking system.

12. A radio-frequency (RF) module comprising:
   a packaging substrate configured to receive a plurality of components; and
   a power amplification system implemented on the packaging substrate, the power amplification system including an amplifier having a voltage port, an input port, and an output port, the amplifier configured to receive a supply voltage at the voltage port to provide power to the amplifier, to receive an input signal at the input port, and to provide an amplified output signal at the output port; and the power amplification system also including a DC-DC converter having a reference port to receive a reference voltage, a coupler port to receive a coupler signal that is correlated to the amplified output signal, a supply port to provide the supply voltage to the amplifier, and a detector and a filter that are configured to generate a bandwidth signal indicative of a bandwidth of the amplified output signal, the DC-DC converter including one or more components configured to modify the provided supply voltage to provide a targeted supply voltage to the amplifier based at least in part on an estimate of a number of resource blocks in the amplified output signal.

13. The RF module of claim 12 wherein the RF module is a front-end module (FEM).

14. The RF module of claim 12 wherein the amplifier and the DC-DC converter are implemented on separate chips.

15. The RF module of claim 12 wherein the amplifier and the DC-DC converter are implemented on the same chip.

16. The RF module of claim 12 wherein the DC-DC converter further includes a conversion module configured to receive the bandwidth signal and to generate a modification voltage that corresponds to the bandwidth based on the bandwidth signal.

17. The RF module of claim 16 wherein the DC-DC converter further includes an addition component configured to generate a DC control voltage by combining the reference voltage and the modification voltage, the supply voltage provided by the DC-DC converter corresponding to the resulting DC control voltage.

18. The RF module of claim 16 wherein the conversion module includes a plurality of cells and the output of individual cells of the plurality of cells is combined to generate the modification voltage.

19. A wireless device comprising:
   a transceiver configured to generate an input radio-frequency (RF) signal;
   a front-end module (FEM) in communication with the transceiver, the FEM including a packaging substrate configured to receive a plurality of components, the FEM further including a power amplification system implemented on the packaging substrate, the power amplification system configured to amplify the input RF signal to generate an amplified output RF signal, the power amplification system including an amplifier having a voltage port, an input port, and an output port, the amplifier configured to receive a supply voltage at the voltage port to provide power to the amplifier, to receive the input RF signal at the input port, and to provide the amplified output RF signal at the output port; the power amplification system also including a coupler configured to generate a coupler signal that corresponds to the amplified output RF signal; and the power amplification system also including a DC-DC converter having a reference port to receive a reference voltage, a coupler port to receive a coupler signal that is correlated to the amplified output RF signal, and a supply port to provide the supply voltage to the amplifier, the DC-DC converter including one or more components configured to modify the supply voltage based at least in part on an estimate of a number of resource blocks in the amplified output RF signal the DC-DC converter including a detector, a filter, and a conversion module that are configured to receive the coupler signal and to generate a bandwidth signal corresponding to the number of resource blocks in the amplified output RF signal based on the coupler signal; and an antenna in communication with the FEM, the antenna configured to transmit the output RF signal.

20. The wireless device of claim 19 wherein the detector includes a first differential detector and a second differential detector and the filter includes at least a high pass filter coupled to the first differential detector and a low pass filter coupled to the second differential detector.

\* \* \* \* \*